United States Patent
Isoda et al.

(10) Patent No.: US 7,553,162 B2
(45) Date of Patent: Jun. 30, 2009

(54) SOCKET FOR ELECTRONIC COMPONENT

(75) Inventors: Masaaki Isoda, Hirakata (JP); Kazuhiro Takamura, Sanda (JP); Tokushi Yamauchi, Hirakata (JP); Katsuyuki Kiyozumi, Hirakata (JP); Nobumichi Nishihama, Katano (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 0 days.

(21) Appl. No.: 11/915,349

(22) PCT Filed: May 25, 2006

(86) PCT No.: PCT/JP2006/310471

§ 371 (c)(1),
(2), (4) Date: Nov. 23, 2007

(87) PCT Pub. No.: WO2006/126645

PCT Pub. Date: Nov. 30, 2006

(65) Prior Publication Data

US 2008/0220631 A1    Sep. 11, 2008

(30) Foreign Application Priority Data

May 25, 2005    (JP) .............................. 2005-152723

(51) Int. Cl.
  *F21V 21/00*    (2006.01)
(52) U.S. Cl. .......................... 439/56; 362/249; 439/487; 439/928
(58) Field of Classification Search .................. 439/56, 439/68, 928, 487; 362/240, 249, 236, 238, 362/646, 800; 257/88, 89
See application file for complete search history.

(56) References Cited

U.S. PATENT DOCUMENTS

| 6,422,716 | B2 * | 7/2002 | Henrici et al. | 362/249 |
| 6,428,189 | B1 * | 8/2002 | Hochstein | 362/373 |
| 6,891,200 | B2 * | 5/2005 | Nagai et al. | 257/88 |
| 7,063,440 | B2 * | 6/2006 | Mohacsi et al. | 362/240 |
| 7,201,511 | B2 * | 4/2007 | Moriyama et al. | 362/646 |
| 2002/0006040 | A1 * | 1/2002 | Kamada et al. | 362/237 |
| 2002/0053726 | A1 | 5/2002 | Mikubo et al. | |

(Continued)

FOREIGN PATENT DOCUMENTS

JP    5-46069    12/1993

(Continued)

*Primary Examiner*—Neil Abrams
(74) *Attorney, Agent, or Firm*—Greenblum & Bernstein, P.L.C.

(57) ABSTRACT

The present invention relates to a socket for electronic component which contains an electronic component. The socket for electronic component comprises a platy base, containers formed to be concaved on a front face of the base and to contain LED packages therein, connectors provided on side faces and connected to other members, supports each of which supports and fixes the LED package contained in the container and electrically connected to the LED package, heat conductors each of which is provided continuously from a bottom face side of the container to a rear face of the base and contacts the LED package contained in the container so as to conduct heat generated by the LED package, and terminals electrically connected to the other members coupled with the connectors and the supports. The heat generated by the LED package is conducted to the rear face of the base through the heat conductors, and effectively radiated to an installation member on which the socket for electronic component is mounted.

11 Claims, 14 Drawing Sheets

U.S. PATENT DOCUMENTS

| | | |
|---|---|---|
| 2002/0113246 A1 | 8/2002 | Nagai et al. |
| 2006/0051988 A1 | 3/2006 | Okura |
| 2006/0258227 A1 | 11/2006 | Ookura |
| 2007/0105408 A1 | 5/2007 | Ookura |

FOREIGN PATENT DOCUMENTS

| | | |
|---|---|---|
| JP | 6-326440 | 11/1994 |
| JP | 11-175400 | 7/1999 |
| JP | 2000-252661 | 9/2000 |
| JP | 2001-351404 | 12/2001 |
| JP | 2002-151640 | 5/2002 |
| JP | 2003-45593 | 2/2003 |
| JP | 2003-168305 | 6/2003 |
| JP | 2004-152652 | 5/2004 |
| JP | 2004-225446 | 8/2004 |

* cited by examiner (a)  (b)

(a)

(b)

(c)

(d)

(a)　　　　　　　　　　　　(b)

(a)

(b)

(a)

(b)

SOCKET FOR ELECTRONIC COMPONENT

TECHNICAL FIELD

The present invention relates to a platy socket for electronic component to contain an electronic component.

BACKGROUND ART

An appliance, which comprises a platy base, electronic components mounted on a surface of the base, a connector provided on a side face of the base so as to be connected to another member, and terminals provided on the connector to be electrically connected to the another member connected to the connector and to be electrically connected to the electric components mounted on the base, and which enables coupling among a plurality of modules, is conventionally known. For example, JP2003-168305A discloses a lighting unit comprising a platy polygonal member, LEDs (Light Emitting Diodes) mounted on a surface of the polygonal member, and more than two sets of terminals respectively provided on different sides of outer peripheries of the polygonal member. In addition, for example, JP2001-351404A discloses a lighting unit comprising a plurality of LEDs two-dimensionally arranged on a circuit board, a connector connected to another member and terminals to be electrically connected to the another member connected to the connector.

DISCLOSURE OF INVENTION

In the lighting unit described in JP2003-168305A, for example, there, however, is no provision to heat generated by the electronic components, so that trouble may occur in operations of the electronic components. Thus, for example, in case those LEDs are used as the electronic components, if the provision for heat is insufficient, temperatures of the LEDs may increase so that lighting efficiency may decrease.

On the other hand, in the lighting unit described in JP2001-351404A, through holes for heat radiation are provided as the provision for heat. The provision for heat of the lighting unit, however, is insufficient when the electronic components are contained in cavities formed on the base, so that heat radiation from bottom face sides of the electronic components may be insufficient, in particular.

In addition, when the electronic components are unitized and an appliance to contain the electronic components is formed as a module of a socket for electronic components having versatility, it can be used in various layouts or various circumferences. However, when provision for heat per each module is insufficient as mentioned above, and when a plurality of modules are used in conjunction with each other, heat may hardly be radiated, so that it requires the provision for heat in each installation circumference, and thus, the installation circumference of the socket for electronic components may be limited.

The present invention solves the above mentioned problems and is purposed to provide a socket for electronic component which enables to increase heat radiation property and to correspond to various installation circumferences.

For accomplishing the above-mentioned purpose, the present invention is a socket for electronic component, into which an electronic component is contained, comprising: a platy base; a container formed on the base to contain the electric component; at least two first terminals provided in the container and electrically connected to electrodes of the electric component contained in the container; a connector provided on a side face of the base, having second terminals electrically connected to the first terminals and being able to be coupled with another member other than the socket itself so as to supply electric power to the electric component through the second terminals; and a support provided in the container to fix the electric component contained in the container, and thus, enabling to radiate heat generated by the electric component contained in the container of the base from a lower face side of the container of the base. Thereby, the socket for electric component in accordance with the present invention enables to increase heat radiation property, and to correspond to various installation circumferences.

Furthermore, in the present invention, it is possible that the container is formed to penetrate through from the front face to rear face of the base; the support fixes the electric component so that a rear face of the electronic component becomes substantially the same plane of the rear face of the base; and the electronic component exposed from the rear face of the base is thermally coupled with a member on which the socket is mounted and which can easily radiate heat.

Still furthermore, a heat conductor contacting the electronic component contained in the container can be provided in the container to conduct heat generated by the electronic component to the rear face of the base. Thereby, the heat generated by the electronic component is effectively conducted from an inner face of the container to the rear face of the base through the heat conductor, so that it is radiated to a member, on which the socket for electronic component is mounted. Therefore, the socket for electronic component in accordance with the present invention enables to increase heat radiation property and to correspond to various installation circumferences as a module having versatility.

Still furthermore, the present invention can further comprise a wiring for heat radiation which is thermally connected to the heat conductor, continuously provided from a peripheral end of the container to a peripheral end of the base, and insulated from the first terminals and the second terminals. Thereby, heat generated by the electronic component can effectively be exhausted through the wiring for heat radiation.

The present invention can further comprise a coolant passage which is thermally connected to the heat conductor, continuously provided from a peripheral end of the container to a peripheral end of the base, and insulated from the first terminals and the second terminals. By circulating a coolant in the coolant passage, heat generated by the electronic component can be radiated effectively.

In the present invention, the heat conductor can comprise an elastic member having heat conductivity on a side contacting the electronic component. According to the elastic member comprise in the heat conductor, degree of contact between the electronic component and the heat conductor is increased, so that heat generated by the electronic component can be radiated more effectively.

In the present invention, it is possible that the base has a first side face and a second side face which are parallel with each other; the connector includes a first connector provided on the first side face and to be coupled with a first member other than the socket itself by moving in a coupling direction substantially perpendicular to the first side face, and a second connector provided on the second side face and coupled with a second member other than the socket itself by moving in the coupling direction; the first connector has a concave portion extending with a substantially constant width in a direction substantially parallel to the coupling direction of the base and the first member; and the second connector has a convex portion engageable with the concave portion and extending with a substantially constant width in the coupling direction.

According to the above mentioned configuration, by moving the socket for electronic component which is an object to be coupled in the coupling direction substantially perpendicular to the first side face and the second side face of the base, a plurality of sockets for electronic component are mechanically coupled, so that the plurality of sockets for electronic element are electrically connected through the second terminals provided in the connector.

In the present invention, the first connector and the second connector can have connectable shapes with shiplap. Thereby, only a part of the sockets for electronic component among the sockets for electronic component coupled by arranging in a plurality of lines can be detached or connected, so that connecting work or interchanging work of the sockets for electronic component can be made easier.

Furthermore, in the present invention, it is possible that the base has a first side face and a second side face which are parallel with each other; the connector includes a first connector provided on the first side face and to be coupled with a first member other than the socket itself by moving in a coupling direction substantially perpendicular to the first side face, and a second connector provided on the second side face and coupled with a second member other than the socket itself by moving in the direction; the first connector has at least one concave portion provided in a direction substantially parallel to the coupling direction of the base and the first member, and the concave portion has a substantially constant width in a direction substantially perpendicular to the coupling direction; and the second connector has at least one convex portion engageable with the concave portion provided in the direction substantially parallel to the coupling direction, and the convex portion has a substantially constant width in the direction substantially perpendicular to the coupling direction.

According to the above mentioned configuration, by moving the socket for electronic component which is an object to be coupled in the coupling direction substantially perpendicular to the first side face and the second side face of the base, a plurality of sockets for electronic component are mechanically coupled, so that the plurality of sockets for electronic element are electrically connected through the second terminals provided in the connector.

In addition, the present invention can provide a power supply circuit to supply predetermined electric power to the electronic component. Thereby, the predetermined electric power can be supplied to the electronic component contained in the container surely, so that the versatility of the socket for electronic component is increased.

BEST MODE FOR CARRYING OUT THE INVENTION

Hereinafter, a socket for electronic component in accordance with a first embodiment of the present invention is described with reference to drawings. The socket for electronic component contains an electronic component such as an LED package which is unitized with LEDs in a state where electric power can be supplied, for example.

Figure 1:
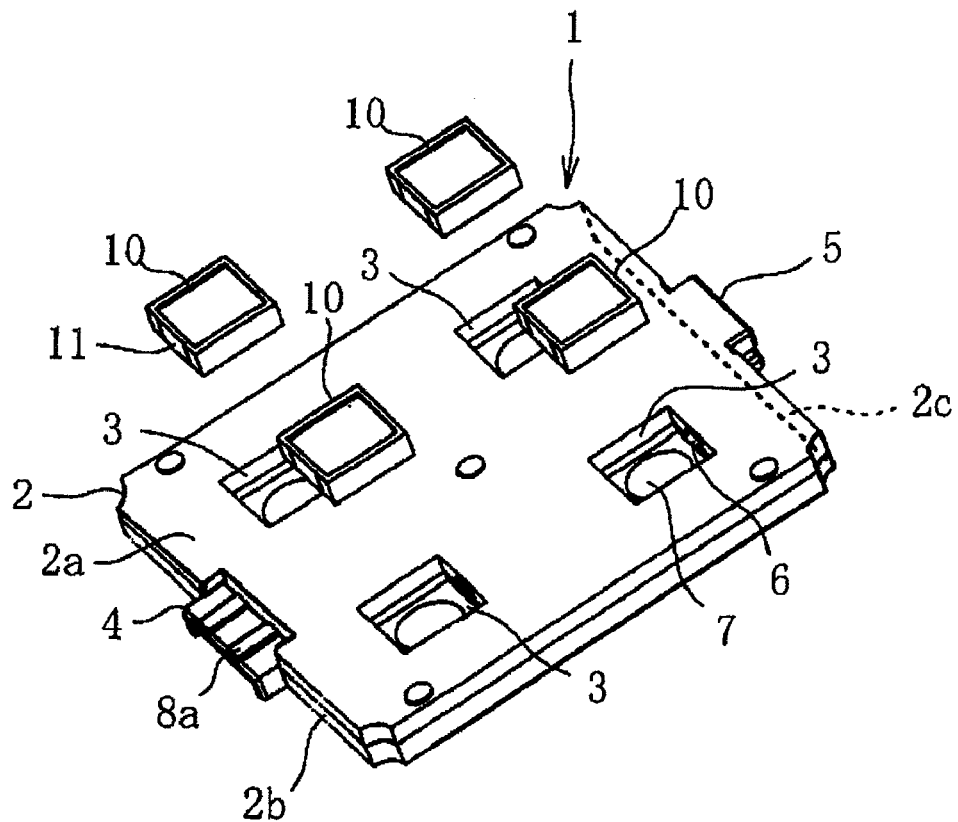
FIG. 1 is a perspective view of a socket for electronic component in accordance with a first embodiment of the present invention.
Figure 2:
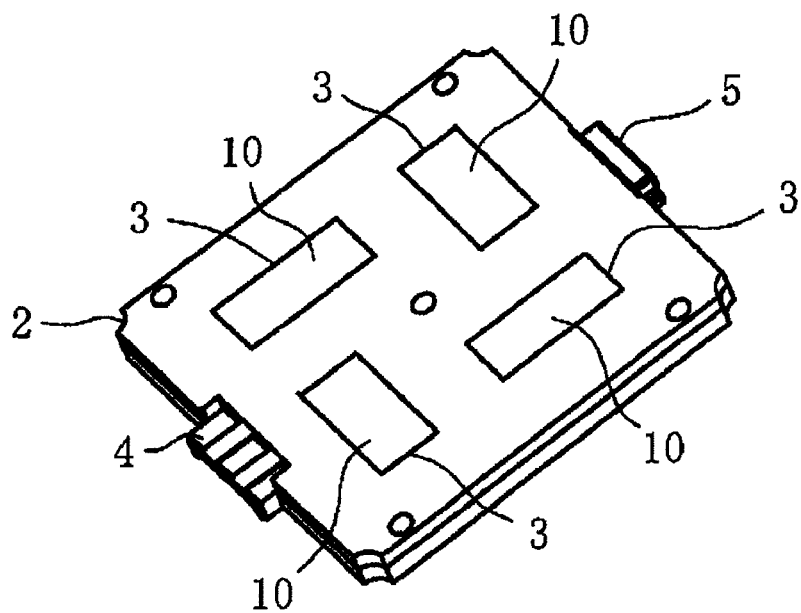
FIG. 2 is a perspective view showing an example of an arrangement of containers of the socket for electronic component.

As shown in FIG. 1, the socket 1 for electronic component comprises a platy base 2, containers 3 each which is formed as a recess on a front face 2a of the base 2 so as to contain an LED package (corresponding to an electronic component) 10, and connectors 4 and 5 (respectively corresponding to a second connector and a first connector) which are provided on side faces 2b and 2c (respectively corresponding to a first side face and a second side face) of the base 2 and to be coupled with other members other than the socket itself. In addition, as shown in FIG. 2, the containers 3 can be arranges as substantially point symmetry so that a center of the base 2 uses as a symmetric point. By arranging the containers 3 as shown in the figure, color heterogeneity in lighting can be restricted.

Supports 6 are provided in the container 3 so that they support and fix the LED package 10 contained in the container 3 and serve as terminals (first terminals) electrically connected to a pair of electrodes 11 provided on the LED package 10. Alternatively, the first terminals may be provided independently from the supports. Although, only one electrode 11 is illustrated on a side of the LED package 10 in FIG. 1, another electrode is provided on another side.

The support 6 has a cantilever structure, so that the LED package 10 is mounted on the base 2 without soldering process. Thus, workability to mount the LED package 10 on the base 2 is increased, and LED packages having different color characteristics can be mounted on the socket 1 for electronic component, simply, and consequently, merchandise diversification becomes easier.

In addition, the socket 1 for electronic component comprises a heat conductor 7 which is continuously provided from a bottom face of the container 3 to the rear face of the base 2. The heat conductor 7 is formed of a material having high heat conductivity such as copper alloy and contacts the LED package 10 contained in the container 3, so that it conducts and radiates heat generated by the LED package 10 to the rear face of the base 2 through the bottom face of the container 3. The heat conductor 7 and the support 6 are electrically insulated.

Figure 3:
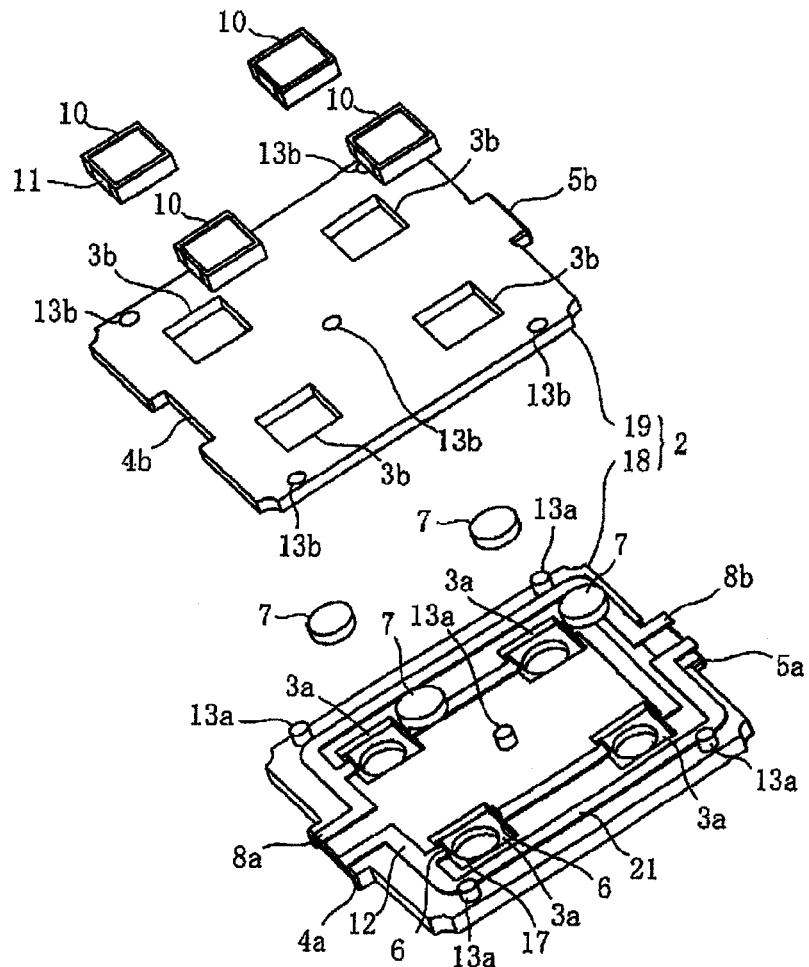
FIG. 3 is an exploded perspective view of the socket for electronic component.

The base 2 has a pair of side faces 2b and 2c which are parallel with each other. The connectors 4 and 5 consist of an inlet connector 4 formed on the side face 2b and an outlet connector 5 formed on the side face 2c. As shown in FIG. 3 which is an exploded perspective view, a pair of inlet terminals 8a (second terminals) and a pair of outlet terminals 8b (second terminals), which are electrically connected to other members coupled with the connectors 4 and 5 and electrically connected to the supports 6, are respectively provided in the connectors 4 and 5.

As shown in the same figure, the base 2 comprises a lower plate portion 18 and an upper plate portion 19. Lower portions 3a of the containers 3, a lower portion 4a of the inlet connector 4 and a lower portion 5a of the outlet connector 5 are formed on the lower plate portion 18. A through hole 17 for fixing heat conductor into which the heat conductor 7 is fitted is formed on the lower portion 3a of the container 3 so as to penetrate from the bottom face of the container 3 to the rear face of the base 2. On the other hand, upper portions 3b of the containers 3, an upper portion 4b of the inlet connector 4 and an upper portion 5b of the outlet connector 5 are formed on the upper plate portion 19. The terminals 8a in the input side provided in the inlet connector 4, the supports 6, and the outlet terminals 8b provided in the outlet connector 5 are electrically connected through wirings 12. Four LED packages 4 contained in the containers 3 are serially connected through the wirings 12 (hereinafter, it may called as series circuit of LED packages). Series circuits of LED packages of the socket for electronic components 1, which are connected through the outlet terminals 8b and the inlet terminals, are connected in parallel with an electric power supply.

The lower plate portion 18 and the upper plate portion 19 are integrated by fitting protrusions 13 formed on the lower plate portion 18 into holes 13b formed on the upper plate portion 19. Alternatively, the base may be formed by insert molding with inserting the wirings 12 therein. By disposing the wirings 12 on the front face 2a or inside of the base 2, the socket 1 for electronic component can be downsized.

Figure 4:
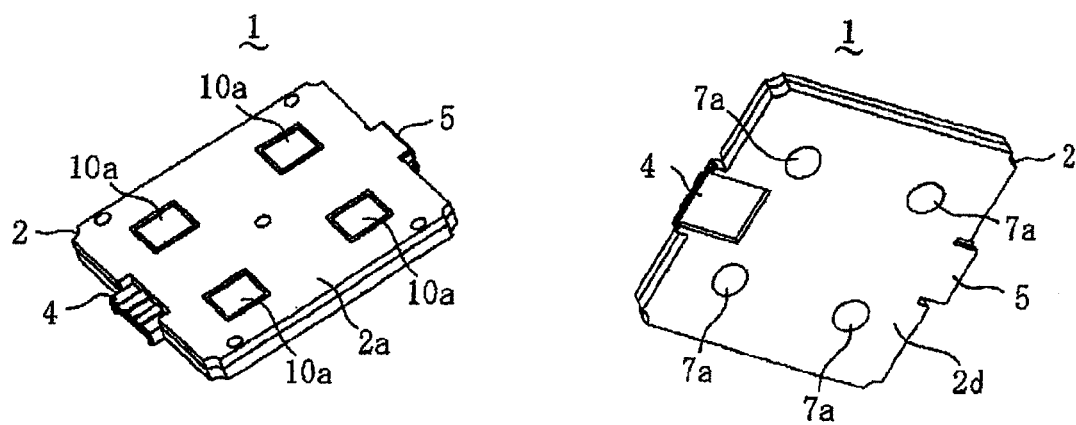
FIG. 4(a) is a perspective view of the socket for electronic component observed from a front face side.
FIG. 4(b) is a perspective view of the socket for electronic component observed from a rear face side.
Figure 5:
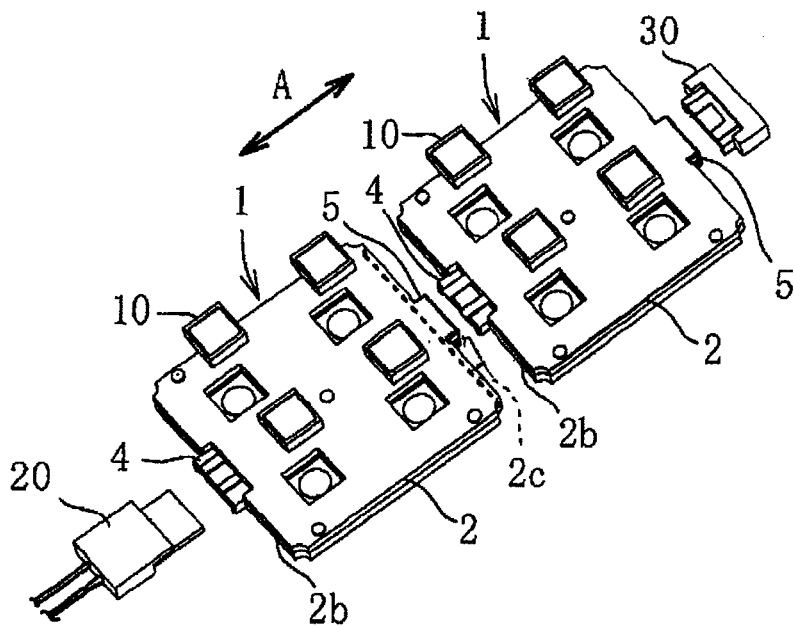
FIG. 5 is a perspective view showing a coupling process of the socket for electronic component.

As shown in FIG. 4(a), the LED packages 10 are contained in the containers 3 so that front faces 10a thereof and the front face 2a of the base 2 constitute substantially the same plane. In addition, as shown in FIG. 4(b), the heat conductors 7 are mounted on the base 2 so that rear faces 7a thereof and the rear face 2b of the base 2 constitute substantially the same plane.

Subsequently, coupling process of the sockets 1 for electronic component is described with reference to FIG. 5 and FIGS. 6(a) to 6(d). An inlet connector 4 of a socket 1 for electronic component is coupled with a connector 20 of an electric power supply or an outlet connector 5 of another socket 1 for electronic component (which corresponds to a first member or a second member) by moving them in a coupling direction shown by arrow A which is substantially perpendicular to the side faces 2b and 2c of the base 2. In addition, the outlet connector 5 of the socket 1 for electronic component is coupled with a closed connector 30 or the inlet connector 4 of the socket 1 for electronic component (which corresponds to the second member or the first member) by moving them in the coupling direction shown by arrow A.

Figure 6:
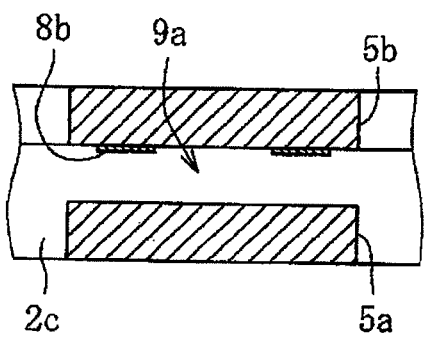
FIG. 6(a) is a sectional view of an outlet connector of the socket for electronic component in a direction substantially perpendicular to the coupling direction.
FIG. 6(b) is a sectional view of an inlet connector in the direction substantially perpendicular to the coupling direction.
FIG. 6(c) is a sectional view of the outlet connector in a direction substantially parallel to the coupling direction.
FIG. 6(d) is a sectional view of the inlet connector in the direction substantially parallel to the coupling direction.
Figure 6:
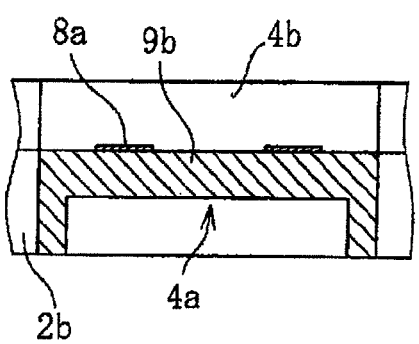
Figure 6:
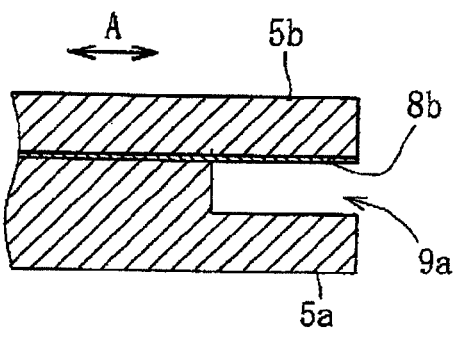
Figure 6:
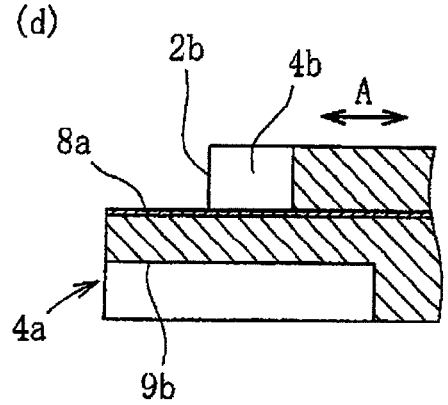

FIGS. 6(a) and 6(b) respectively show cross sections of the outlet connector 5 and the inlet connector 4 in a direction substantially perpendicular to the coupling direction shown by arrow A. FIGS. 6(c) and 6(d) respectively show cross sections of the outlet connector 5 and the inlet connector 4 in a direction substantially parallel to the coupling direction shown by arrow A. As shown in FIGS. 6(a) and 6(c), the outlet connector (first connector) 5 has a concave portion 9a which extends in a direction substantially parallel to the coupling direction shown by arrow A with a substantially constant width. On the other hand, as shown in FIGS. 6(b) and 6(d), the inlet connector (second connector) 4 has a convex portion 9b which is engageable with the concave portion 9a provided on the outlet connector 5 and extends in the direction substantially parallel to the coupling direction shown by arrow A with a substantially constant width.

Figure 7:
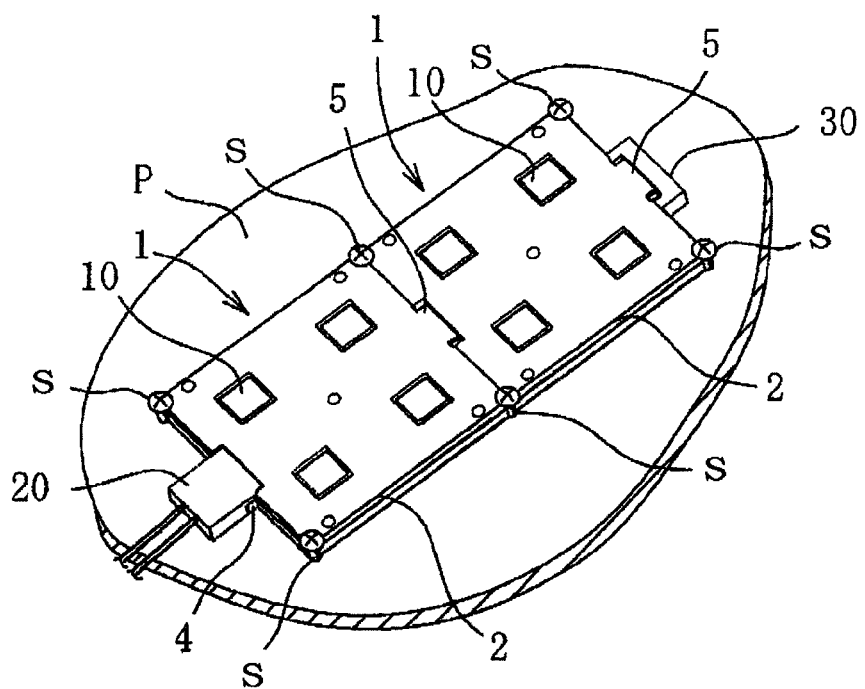
FIG. 7 is a perspective view showing an installation state of coupled sockets for electronic component.

The socket 1 for electronic component, which serves as an object to be coupled, is disposed in a manner so that the inlet connector 4 thereof faces the outlet connector 5 of the other socket 1 for electronic component and moved in the coupling direction shown by arrow A, and thereby, the convex portion 9b of the inlet connector 4 is inserted into and engaged with the concave portion 9a of the outlet connector 5. Simultaneously, a plurality of sockets 1 for electronic component is electrically connected through the inlet terminals 8a and the outlet terminals 8b respectively provided in the connectors 4 and 5. As shown in FIG. 7, the sockets 1 for electronic component are fixed on an installation member P formed of a material having high radiation property with a thermally coupled state by screws S or the like. The installation member S is a metal frame to support a housing of a lighting apparatus, for example.

The socket 1 for electronic component in accordance with this embodiment can conduct heat generated by the LED packages 10 contained in the containers 3 to the bottom face sides of the containers 3 through the heat conductors 7 and radiate the heat to the installation member P, so that it is possible to increase heat radiation property and to correspond to various installation circumferences as a module with versatility.

In addition, the inlet connector 4 and the outlet connector 5 are formed as mentioned above, a plurality of sockets can be mechanically coupled with each other by moving the socket for electronic component corresponding to an object to be coupled in the coupling direction shown by arrow A, and the plurality of sockets 1 for electronic component are electrically connected through the inlet terminals 8a provided in the inlet connector 4 and the outlet terminals 8b provided in the outlet connector 5.

Moreover, since mechanical coupling and electrical connection of the sockets 1 for electronic component are performed simultaneously by coupling the connectors 4 and 5, installation of them into a lighting apparatus becomes easier, and visual quality can be increased because it needs no lead wires for interconnection.

Figure 8:
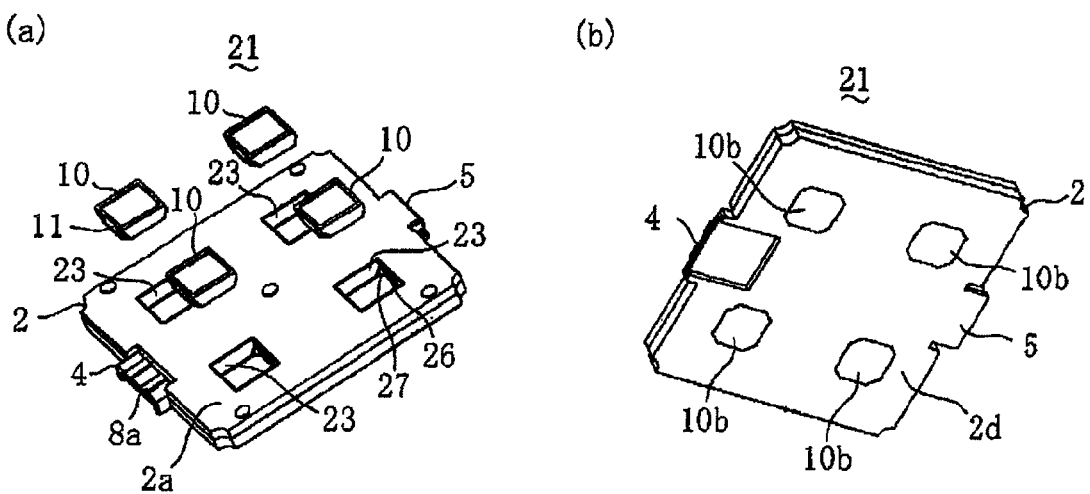
FIG. 8(a) is a perspective view of a socket for electronic component in accordance with a second embodiment of the present invention observed from a front face side.
FIG. 8(b) is a perspective view of the same observed from a rear face side.

Subsequently, a socket for electronic component in accordance with a second embodiment of the present invention is described with reference to FIG. 8. A socket 21 for electronic component in this embodiment is different from that in the first embodiment at points that containers 23 are formed to penetrate from a front face 2a to a rear face 2d of a base 2, and LED packages 10 are supported so that rear faces 10b of the LED packages 10 and the rear face 2d of the base 2 constitute substantially the same plane.

The socket 21 for electronic component comprises the platy base 2, containers 23 which are formed to penetrate the base 2 from the front face 2a to the rear face 2d, and connectors 4 and 5 which are to be coupled with members other than the socket itself. Terminals (first terminals) 11 which are electrically connected to a pair of electrodes 11 of the LED package 10 contained in the container 23 and a support 27 which supports and fixes the LED package 10 in a manner so that the rear face of the LED package 10 and the rear face 2d of the base 2 constitute substantially the same plane are provided on each container 23. In addition, the rear face 10b of the LED package 10 exposed on the rear face 2d of the base 2 can thermally connected to a member having high heat radiation property to which the socket for electronic component is mounted. Terminals (second terminals) 8a, which are to be electrically connected to not only electrodes or the like provided on a member other than the socket itself but also terminals 26, are further provided in the connector 4.

According to the socket 21 for electronic component of this embodiment, the LED packages 10 are contained in the containers 23 of the above mentioned structure, so that heat generated by the LED package 10 is directly exhausted to an installation member P on which the socket 21 for electronic component is mounted through the rear face 10b of the LED package 10 exposed from the rear face 2d of the base 2. Thus, heat radiation property of the socket 21 for electronic component can be increased, and it can correspond to various installation circumferences as a module having versatility.

Subsequently a socket for electronic component in accordance with a third embodiment of the present invention is described with reference to FIG. 9 and FIGS. 10(a) and 10(b). A socket 31 for electronic component of this embodiment is different from that of the first embodiment at points of comprising not only wirings 12 for supplying electronic power but also wirings 32 for heat radiation. The points of comprising the base 2, the containers 3, the connectors 4 and 5, the first terminals, the supports, the heat conductors, the inlet terminals 8a and the outlet terminals 8b are the same as those in the first embodiment. Besides, the upper plate portion 19 is illustrated by dotted lines.

Figure 10:
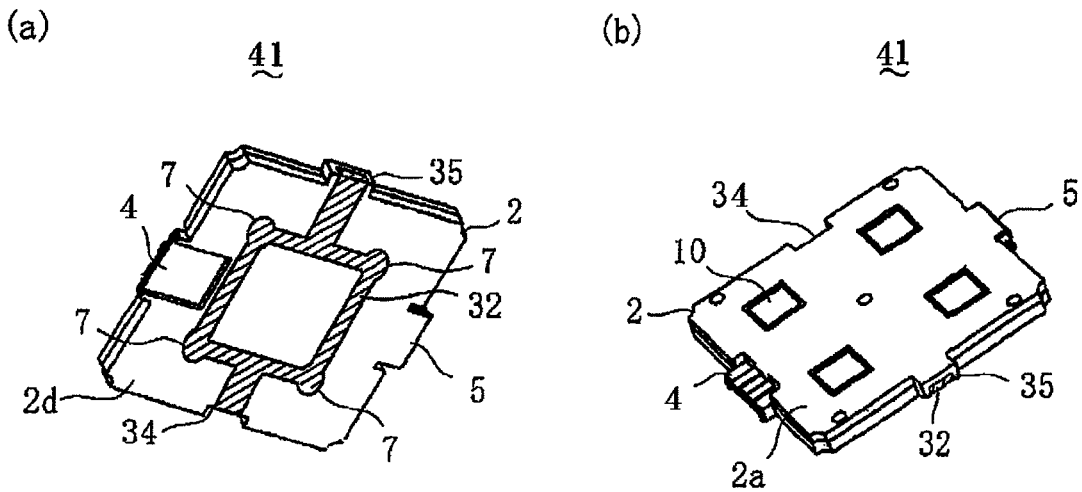
FIG. 10(a) is a perspective view of a socket for electronic component observed from a front face side for showing an example of an arrangement of wiring for heat radiation or coolant passage.
FIG. 10(b) is a perspective view of the same observed from a bottom face side.

The wirings 32 for heat radiation are thermally connected to the heat conductors 7, continuously provided from peripheral ends of the containers 3 to peripheral ends of the base 2, and electrically insulated from the inlet terminals 8a, the outlet terminals 8b and the wirings 12 for supplying electric power. The wirings 32 for heat radiation are formed of a material having high heat conductivity such as copper alloy. Connectors 34 and 35 for heat radiation, which are connected to other members, are provided on side faces of the base 2 further to the connectors 4 and 5 for supplying electric power. Heat generated by the LED package 10 is conducted to the members other than the socket itself coupled with the socket 31 for electronic component through the connectors 34 and 35 for heat radiation. Although, it is described that the wirings 32 for heat radiation are disposed on the same plane as the wirings 12 for supplying electric power in this embodiment, it is possible to dispose the wirings 12 for supplying electric power in the base 2 and to dispose the wirings 32 for heat radiation on the rear face 2d of the base 2, as shown in FIGS. 10(1) and 10(b).

Since the socket 32 for electronic component of this embodiment comprises the wirings 32 for heat radiation further to the above mentioned heat conductors 7, heat generated by the LED package 10 can be exhausted more effectively. In addition, by coupling the socket 31 for electronic component to other members other than the socket itself through the connectors 34 and 35 for heat radiation in an installation circumference where heat cannot be radiated to the rear face 2d side of the base 2, heat generated by the LED package 10 can be lead to a direction other than the rear face 2d of the base 2, so that the heat can be exhausted effectively at a place other than the rear face 2d of the base 2.

Subsequently, a socket for electronic component in accordance with a fourth embodiment of the present invention is described. A socket for electronic component of this embodiment is different from that of the third embodiment at a point to comprise coolant passages instead of the wirings for heat radiation. The points of comprising the base, the containers, the connectors, the heat conductors, the inlet terminals and the outlet terminals are the same as those in the first to third embodiments.

Figure 9:
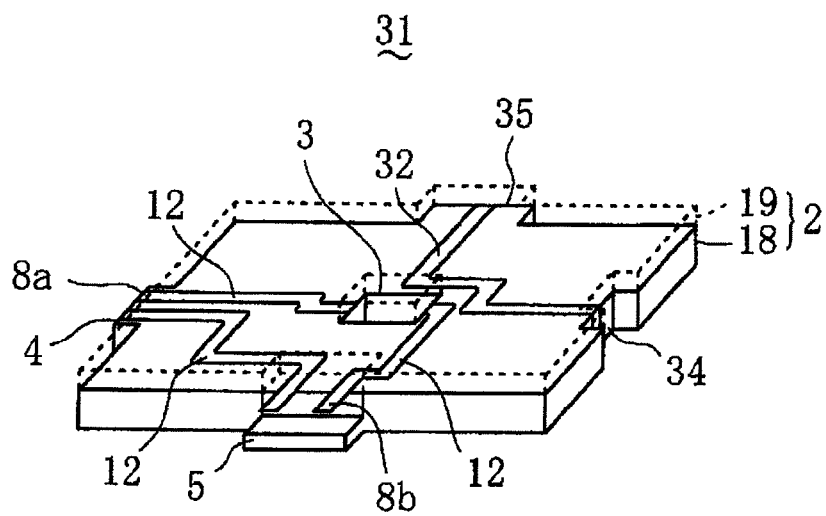
FIG. 9 is a partial perspective view of a socket for electronic component in accordance with a third or a forth embodiment of the present invention.

The above mentioned coolant passages are thermally connected to the heat conductors 7, continuously provided from peripheral ends of the containers 3 to peripheral ends of the base 2, and electrically insulated from the inlet terminals 8a, the outlet terminals 8b and the wirings 12 for supplying electric power, similar to the wirings 32 for heat radiation of the socket 31 for electronic component in accordance with the third embodiment (see FIG. 9 and FIGS. 10(a) and 10(b)). The coolant passages are connected to a water-cooling pump, so that heat generated by the LED package 10 is exhausted outward of the socket for electronic component by circulating the coolant through the water-cooling pump.

As mentioned above, the socket for electronic component of this embodiment circulates the coolant in the coolant passages further to the above mentioned heat conductors, so that heat generated by the LED package can be effectively exhausted.

Subsequently, a socket for electronic component in accordance with a fifth embodiment of the present invention is described with reference to FIGS. 11 to 13. A socket 51 for electronic component of this embodiment is different from that of the first embodiment at a point that the heat conductor 7 comprises an elastic member having heat conductivity at a side contacting with the LED package 10. The points of comprising the base 2, the containers 3, the connectors 4 and 5, the supports, the heat conductors, the inlet terminals 8a and the outlet terminals 8b are the same as those in the first embodiment.

Figure 11:
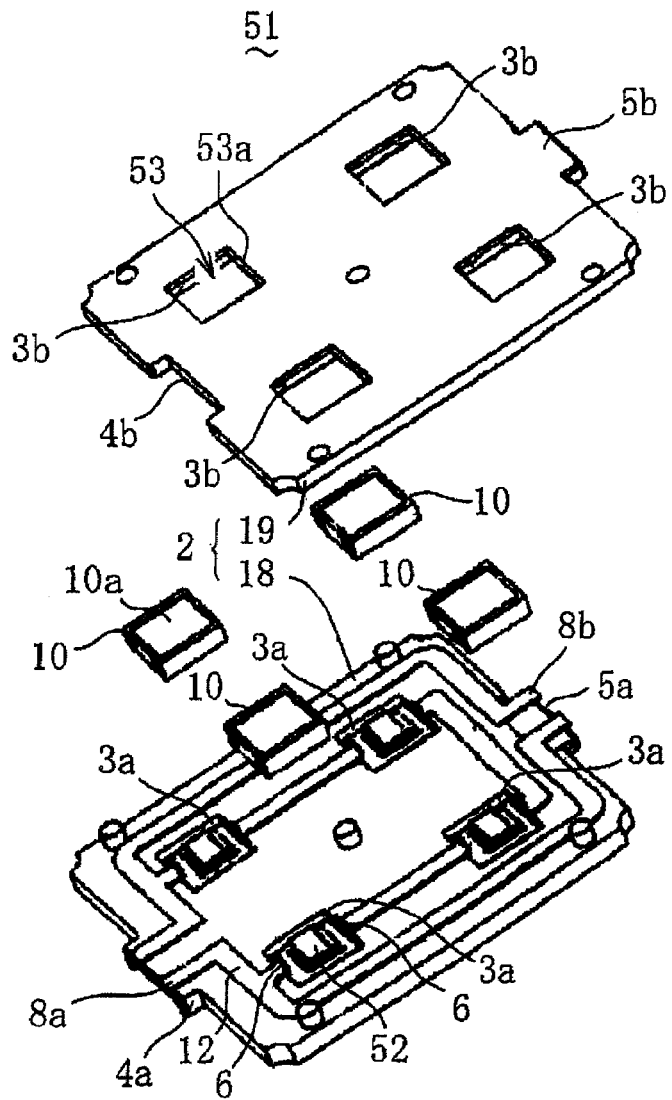
FIG. 11 is an exploded perspective view showing a socket for electronic component in accordance with a fifth embodiment of the present invention.
Figure 12:
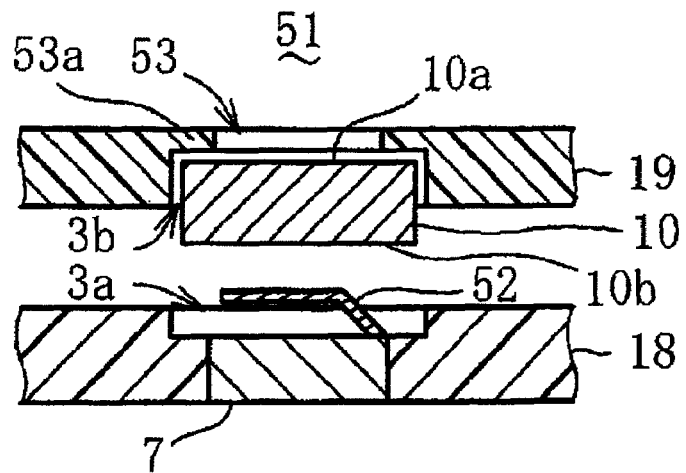
FIG. 12 is a sectional view of a vicinity of a container of the socket for electronic component.
Figure 13:
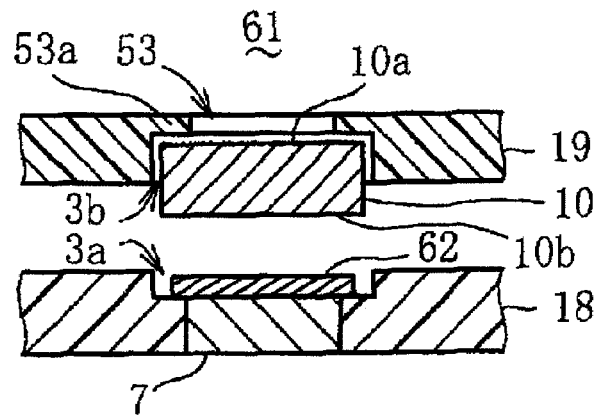
FIG. 13 is a sectional view of the vicinity of the container of the socket for electronic component for showing an example of use of an elastic member having heat conductivity.

As shown in FIGS. 11 and 12, a plate spring 52 is used as the elastic member having heat conductivity, for example. In addition, an opening 53 which is a little narrower than an area of the front face 10a of the LED package 10 is formed on the upper plate portion 19 of the base 2, outer peripheries of the front face 10a of the LED package 10 are supported by outer peripheries 53a of the opening 53. The LED package 10 is disposed between the upper plate portion 19 and the lower plate portion 18 of the base 2, and contained in the container 3 in a state that the rear face 10b of the LED package 10 is closely contacted with the plate spring 52 by being pressed to the lower plate portion 18 by the peripheries 53a of the opening 53 formed on the upper plate portion 19.

Since the shape of the spring is not limited in particular, it is possible to have nay shape such as a cantilever spring or a center impeller type spring which enables to be contacted closely with the LED package 10 by elasticity. In addition, a heat conductive sheet 62 having elasticity is disposed on the bottom face side of the container 3 instead of the plate spring 52, so that the LED package 10 is contacted closely with the heat conductive sheet 62 by pressing the LED package 10 toward the heat conductive sheet 62 by the upper plate portion 19, like a socket 61 for electronic component shown in FIG. 13.

Since the socket 52 for electronic component of this embodiment comprises the above mentioned elastic member, degree of contact between the LED package 10 and the heat conductor 7 can be increased. Thus, heat generated by the LED package 10 can be exhausted effectively, so that lighting efficiency of the LED can be increased.

Figure 14:
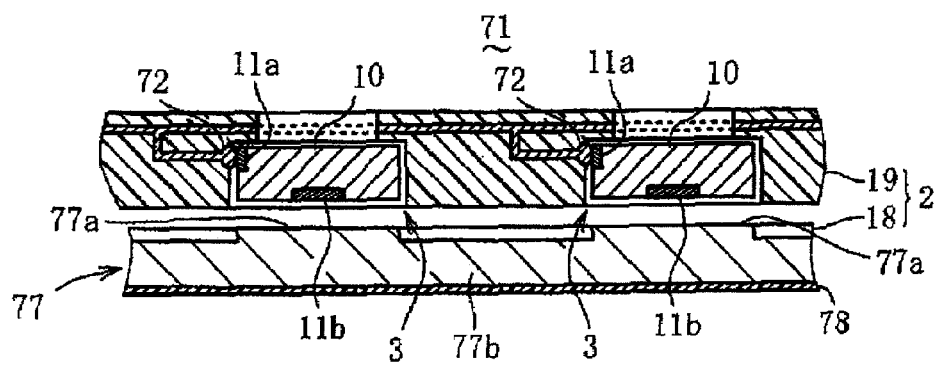
FIG. 14 is a sectional view a sectional view of a vicinity of a container of a socket for electronic component in accordance with a sixth embodiment of the present invention.

Subsequently, a socket for electronic component in accordance with a sixth embodiment of the present invention is described with reference to FIG. 14. A socket 71 for electronic component of this embodiment is different from that of the first embodiment at a point that heat conductors 77 serve as wirings and terminals for supplying electric power. The points of comprising the base 2, the containers 3, the connectors, the first terminals, the inlet terminals and the outlet terminals are the same as those in the first embodiment. In addition, the LED package 10 is fixed by being nipped between the upper plate portion 19 and the lower plate portion 18.

A pair of terminals (first terminals) electrically connected to the LED package 10 contained in the container 3 is disposed at positions facing electrodes 11a and 11b of the LED package 10. FIG. 14 shows an example that one terminal 72 is disposed on the upper plate portion 19 to face the electrode 11a formed on a side face of the LED package 10, and the other terminal 77a and a heat conductor 77 serving as a wiring 77b electrically connected to the terminal 77a are disposed on the lower plate portion 18 to face the electrode 11b formed on the rear face of the LED package 10. The heat conductor 77 formed on the lower plate portion 18 is made of a material having high heat conductivity such as copper alloy, so that it conducts and exhausts heat generated by the LED package 10 by contacting the LED package 10 contained in the container 3. In addition, an insulation sheet 78 or the like is adhered on the rear face 2d of the base 2 so as to insulate the wiring 77b\

According to the socket 71 for electronic component of this embodiment, since the heat conductor 77 serves as the wiring 77b for supplying electric power, wirings become simple, and thus manufacturing cost of the socket 71 for electronic component can be restricted.

Subsequently, a socket for electronic component in accordance with a seventh embodiment of the present invention is described with reference to FIG. 15 and FIG. 16. A socket for electronic component of this embodiment is different from that of the first embodiment at points that shapes and coupling directions of inlet connector and outlet connector are different. The points of comprising the base, the containers, the connectors, the supports, the heat conductors, the inlet terminals and the outlet terminals are the same as those in the first embodiment.

Figure 15:
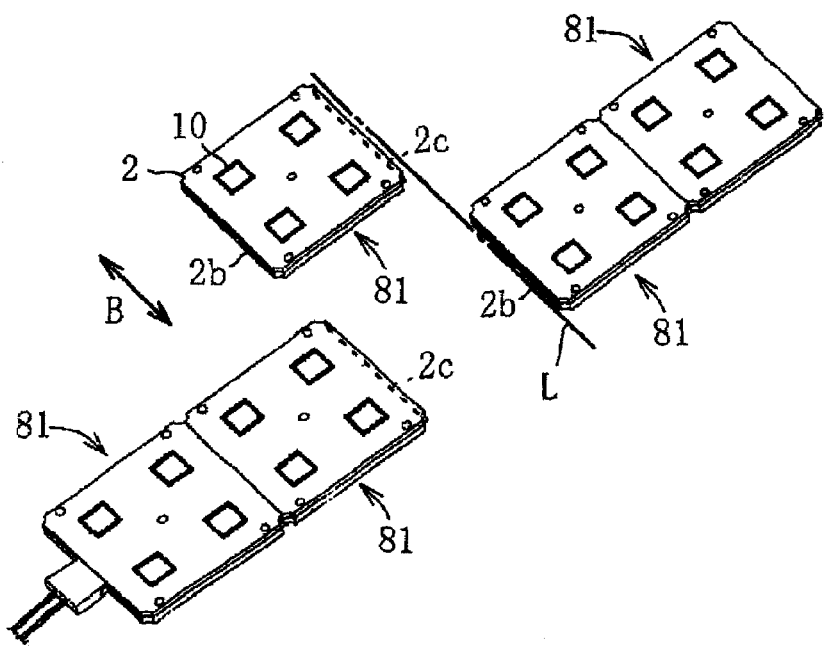
FIG. 15 is a perspective view showing a coupling process of sockets for electronic component in accordance with a seventh embodiment of the present invention.
Figure 16:
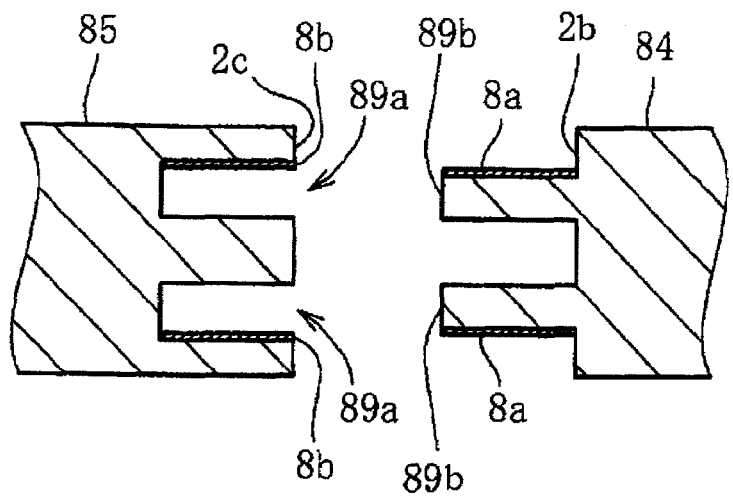
FIG. 16 is a sectional view of an inlet connector and an outlet connector of the socket for electronic component in a direction parallel to a coupling direction.

As shown in FIG. 15 and FIG. 16, the base 2 of the socket 81 for electronic component has a pair of side faces 2b and 2c which are substantially parallel with each other. An outlet connector (first connector) 85 is provided on the side face 2c of the base 2, and coupled with another member (which corresponds to a first member other than the socket itself) by being moved in a direction substantially parallel to the side face 2c shown by arrow B. In addition, an inlet connector (second connector) 84 is provided on the side face 2b of the base 2, and coupled with another member (which corresponds to a second member other than the socket itself) by being moved in the above mentioned direction shown by arrow B. Besides, the above mentioned direction shown by arrow B is substantially parallel to an installation face on which the socket 81 for electronic component is mounted in this embodiment.

FIG. 16 shows cross sections of the inlet connector and the outlet connector which is substantially perpendicular to the above mentioned direction shown by arrow B and substantially parallel to the coupling direction of the sockets 81 for electronic component. The outlet connector 85 has at least one concave portion 89a which is provided in a direction substantially parallel to the coupling direction of the base 2 and the first member. The concave portion 89a has a substantially constant width in a direction substantially perpendicular to the coupling direction of the sockets 81 for electronic component. The inlet connector 84 is engageable with the concave portion 89a, and has at least one convex portion 89b which is provided in a direction substantially parallel to the coupling direction of the sockets 81 for electronic component. The convex portion 89b has a substantially constant width in a direction substantially perpendicular to the coupling direction of the sockets 81 for electronic component. Although, FIG. 16 shows an example in which two sets of the concave portions 89a and the convex portions 89b, it is sufficient to provide at least one pair of them.

The socket 81 for electronic component, which is an object to be coupled, is coupled so that the inlet connector 84 thereof and the outlet connector 85 of the other socket 81 for electronic component are disposed on the same line L (see FIG. 15) extending in the coupling direction shown by arrow B, and the convex portion 89b of the inlet connector 84 is fitted into the concave portion 89a of the outlet connector 85 by moving them in the direction shown by arrow B which is substantially parallel to the side faces 2c and 2b. At this time, a plurality of sockets 81 for electronic component is electrically connected through the inlet terminals 8a and the outlet terminals 8b which are provided in the connectors 84 and 85, simultaneously.

According to the socket 81 for electronic component of this embodiment, since the inlet connector 84 and the outlet connector 85 are formed as mentioned above, a plurality of sockets for electronic component is mechanically coupled and the plurality of sockets for electronic component is electrically connected through the inlet terminals 8a and the outlet terminals 8b respectively provided in the inlet connector 84 and the outlet connector 85 by moving the sockets 81 for electronic component which are the objects to be coupled in the direction shown by arrow B substantially parallel to the side faces 2b and 2c of the base.

In addition, according to the socket 81 for electronic component of this embodiment, in a condition that a plurality of sockets for electronic component is coupled in a direction substantially perpendicular to the side faces 2b and 2c of the base 2 as shown in FIG. 15, it is possible to interchange an intermediate socket 81 for electronic component which is an object to be replaced by sliding the socket in the coupling direction shown by arrow B when the intermediate socket 81 for electronic component is interchanged.

Figure 17:
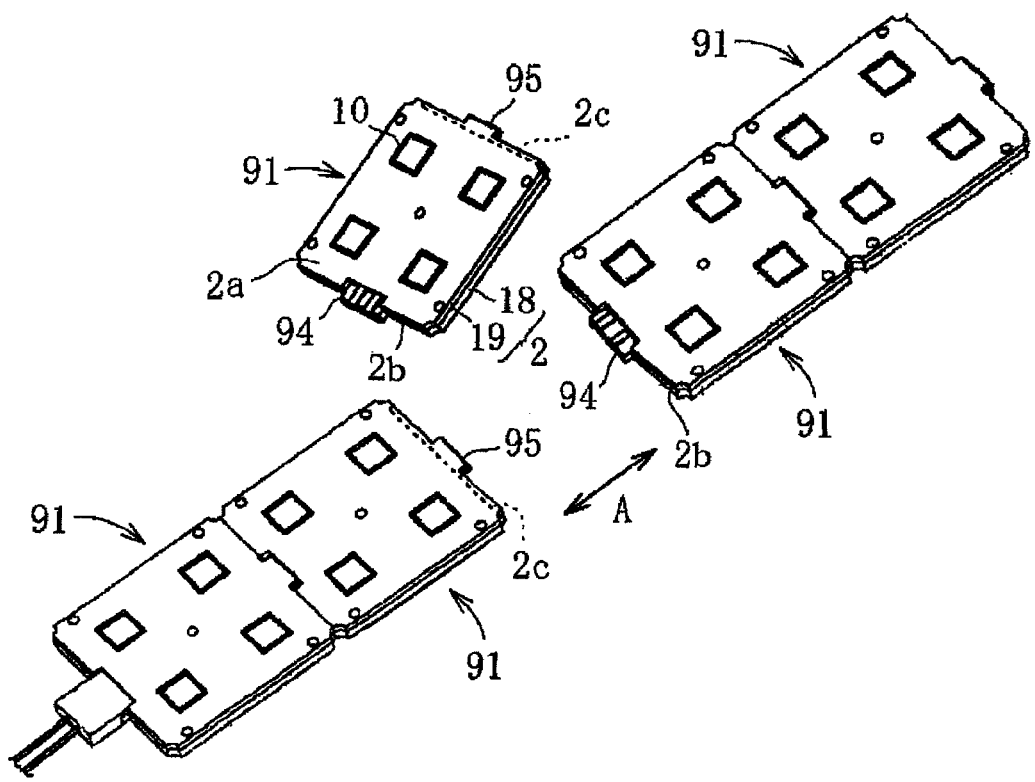
FIG. 17 is a perspective view for showing a coupling process of sockets for electronic component in accordance with an eighth embodiment of the present invention.
Figure 18:
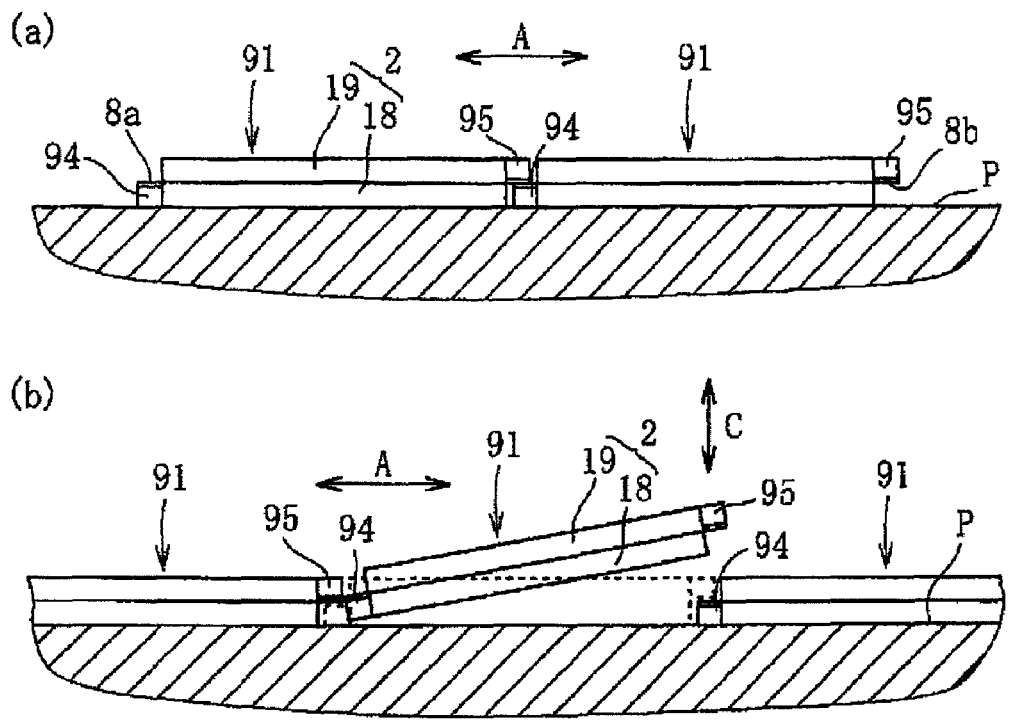
FIG. 18(a) is a side view showing the coupling process of the sockets for electronic component.
FIG. 18(b) is a side view showing an interchanging process of the sockets for electronic component.

Subsequently, a socket for electronic component in accordance with an eighth embodiment of the present invention is described with reference to FIG. 17 and FIGS. 18(*a*) and 18(*b*). A socket 91 for electronic component of this embodiment is different from that of the first embodiment at a point that an inlet connector 94 and an outlet connector 95 respectively have structures connectable with each other by shiplap. The points of comprising the base 2, the containers 3, the supports, the heat conductors, the inlet terminals and the outlet terminals are the same as those in the first embodiment.

The inlet connector 94 and the outlet connector 95 are formed by cutting off end portions of the socket 91 for electronic component by half in thickness direction, that is, the inlet connector 94 is formed by cutting off the end portion of the upper plate portion 19 and the outlet connector is formed by cutting off the end portion of the lower plate portion 18. In this embodiment, a cut-off portion of the outlet connector 95 corresponds to the concave portion 9a in the first embodiment, and a non-cut-off portion of the outlet connector 95 corresponds to the convex portion 9b in the first embodiment. In this embodiment, these inlet connector 94 and outlet connector 95 are coupled by being moved in the coupling direction shown by arrow A substantially perpendicular to the side faces 2b and 2c of the base 2.

The socket 91 for electronic component, which is an object to be coupled, is coupled so that the inlet connector 94 is disposed to face the outlet connector 95 of the other socket 91 for electronic component, and the inlet connector 94 is fitted into a space between the outlet connector 95 and an installation member P by being moved in the coupling direction shown by arrow A. At this time, a plurality of sockets 91 for electronic component is electrically connected through the inlet terminals 8a and the outlet terminals 8b which are provided in the connectors 94 and 95, simultaneously.

In addition, since the coupling structure of the inlet connector 94 and the outlet connector 95 has an allowance, when the outlet connector 95 is pulled up in a direction shown by arrow C which is substantially perpendicular to an installation plane of the installation member P from a condition that the inlet connector 94 and the outlet connector 95 are coupled and the inlet connector is drawn out, the socket 91 for electronic component can be detached. Thus, in a condition that a plurality of sockets 91 for electronic component is coupled in the coupling direction shown by arrow A and a plurality of coupled sockets 91 for electronic component are arranged two-dimensionally, when an intermediate socket for electronic component is interchanged, only the socket 91 for electronic component which is the object to be replaced can be detached by pulling up it in the direction perpendicular to the installation plane of the installation member P.

According to the socket 91 for electronic component of this embodiment, since the inlet connector 94 and the outlet connector 95 has the connectable structure of shiplap, coupling work and interchanging work of the sockets 91 for electronic component becomes easier.

Figure 19:
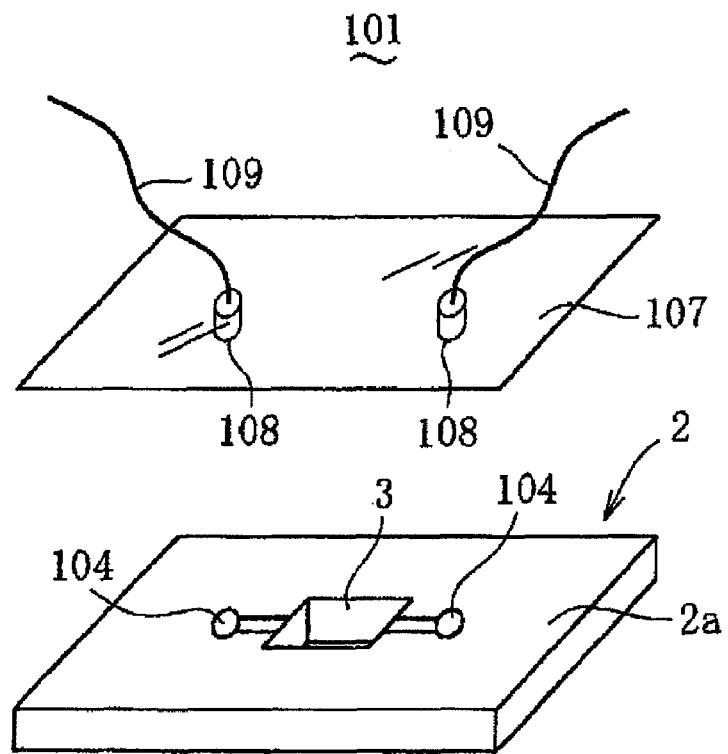
FIG. 19 is a perspective view of a socket for electronic component in accordance with a ninth embodiment of the present invention.

Subsequently, a socket for electronic component in accordance with a ninth embodiment is described with reference to FIG. 19. A socket 101 for electronic component of this embodiment is different from that of the first embodiment at a point that it further comprises a transparent cover member 107 disposed on the front face 2a side of the base 2. The points comprising the base 2, the containers 3, the supports, and the heat conductors are the same as those in the first embodiment.

The transparent cover member 107 comprises a pair of electrode pins 108 and lead wires 109 electrically connected to the electrode pins 108. Waterproof finis is performed between the lead wires 109 and the electrode pins 108. Concave portions 104, into which the electrode pins 108 are fitted, are formed on the front face 2a of the base 2 at positions facing the electrode pins 108 of the cover member 107. Terminals (second terminals) which are connected to the electrode pins 108 are formed in the concave portions 104. The cover member 107 is attached to the base 2 by fitting the electrode pins 108 into the concave portions 104 of the base 2, and the LED package contained in the container 3 is sealed in a state that the electrode pins 8 are fit into the concave portions 104. In addition, in order to seal the LED package contained in the container 3 surely, it is preferable to dispose a packing between the cover member 107 and the base 2 or to fill filler onto a contacting face of the cover member 107 and the base 2. Since shapes of the electrode pins 108 of the cover member 107 and the connectors are not limited in particular, they may be formed to surface contact with each other. When the sockets 101 for electronic component are coupled, the sockets 101 for electronic component are arranged, and wiring work is performed by connecting the lead wires 109.

Since the LED package contained in the container 3 is sealed, the socket 101 for electronic component of this embodiment has high waterproofing property.

Subsequently, a socket for electronic component in accordance with tenth embodiment of the present invention is described with reference to FIG. 20 and FIG. 21. A socket 111 for electronic component of this embodiment is different from those in the first to ninth embodiments at a point to comprise an electric power circuit 110 for supplying predetermined electric power to the LED package 10 contained in the container. The points comprising the base, the containers, the connectors 4 and 5, the supports, the heat conductors, the inlet terminals and the outlet terminals are the same as those in the first embodiment or the like.

Figure 20:
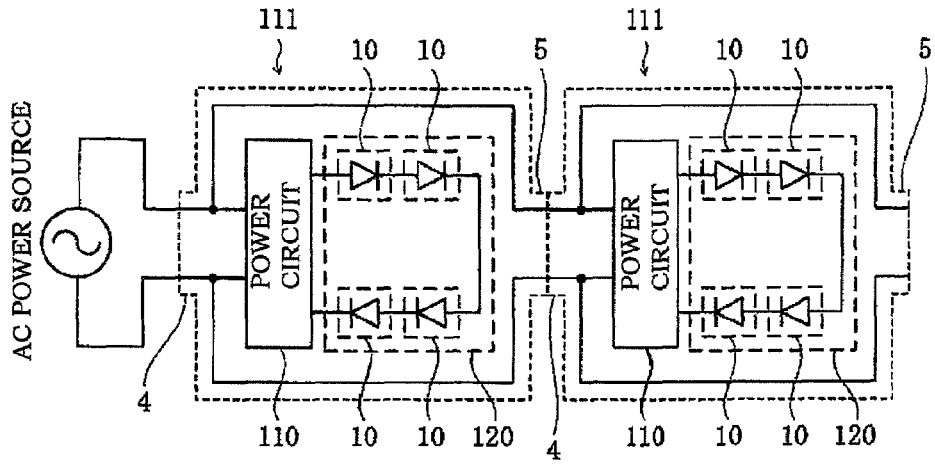
FIG. 20 is a circuit block diagram of a socket for electronic component in accordance with a tenth embodiment of the present invention.
Figure 21:
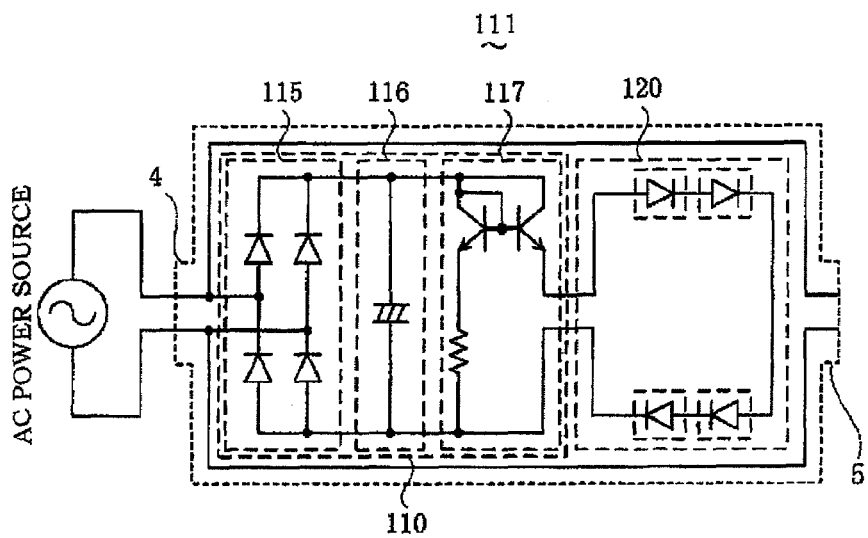
FIG. 21 is a circuit block diagram showing details of a power supply circuit of the socket for electronic component.

As shown in a circuit block diagram of FIG. 20, the socket 111 for electronic component comprises an internal electric power circuit for driving LED. The electric power circuit 110 is disposed between the inlet terminals provided in the inlet connector 4 and a series circuit 120 of the LED packages, so that the LED packages 10 contained in the containers 3 are electrically connected to an AC electric power supply. In addition, wirings between the inlet terminals and the electric power circuit 10 are electrically connected to the outlet terminals provided in the outlet connector 5, so that inlet terminals of another socket 111 for electronic component can be connected to the outlet terminals. As shown in FIG. 21, the electric power circuit 110 comprises a rectification circuit 115, a smoothing circuit 116 and a constant current circuit 117, and a current mirror circuit is used as the constant current circuit 117.

According to the socket 111 for electronic components of this embodiment, since it comprises the electric power circuit 110 for supplying the predetermined electric power to the LED packages 10 contained in the containers, it is possible to supply the predetermined electric power to the LED packages 10 of each coupled sockets 111 for electronic component, surely. In other words, when providing no electric power circuit in each socket for electronic component, and when a plurality of sockets for electronic component coupled with each other is connected to a single electric power circuit together, it is necessary to design an electric power circuit to assume a largest number of the sockets for electronic component coupled with each other. However, according to this embodiment, since each socket 111 for electronic component comprises the electric power circuit 110, it is possible to supply the predetermined electric power to the LED packages 10 in each socket 111 for electronic component coupled with each other, surely without considering the largest number of the sockets to be coupled.

In addition, since the electric power circuit 110 of the socket 111 for electronic component can be selected properly corresponding to the kind of the LED package 10 to be mounted, even when a socket 111 for electronic component having a different sum of forward voltages of the LED packages 10 is coupled, it is possible to prevent defects such as unevenness of brightness of the LEDs in each socket 111 for electronic component or non-lighting of the LEDs in a part of the sockets for electronic component.

Figure 22:
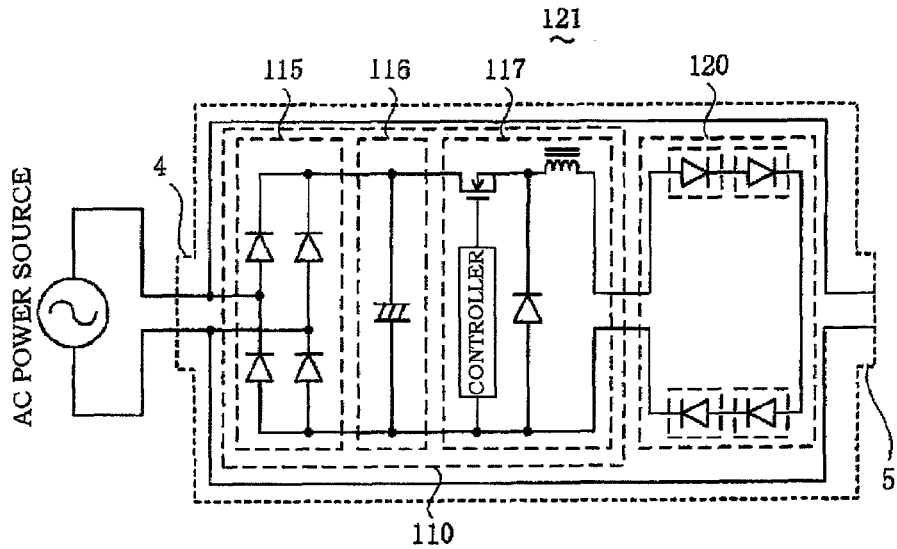
FIG. 22 is a circuit block diagram of a socket for electronic component in accordance with an eleventh embodiment.

Subsequently, a socket for electronic component in accordance with an eleventh embodiment of the present invention is described with reference to FIG. 22. A socket 121 for electronic component of this embodiment is different from that of the tenth embodiment at a point that a back converter circuit is used as the constant current circuit 117 of the electric power circuit 110. The points comprising the base, the containers, the connectors 4 and 5, the supports, the heat conductors, the inlet terminals and the outlet terminals are the same as those in the first embodiment or the like.

Subsequently, a socket for electronic component in accordance with a twelfth embodiment of the present invention is described with reference to FIG. 23. A socket 131 for electronic component of this embodiment is different from those of the tenth embodiment and eleventh embodiment at a point of comprising an electric power circuit 110 for a DC electric power supply. The points comprising the base, the containers, the connectors 4 and 5, the supports, the heat conductors, the inlet terminals and the outlet terminals are the same as those in the first embodiment or the like.

Figure 23:
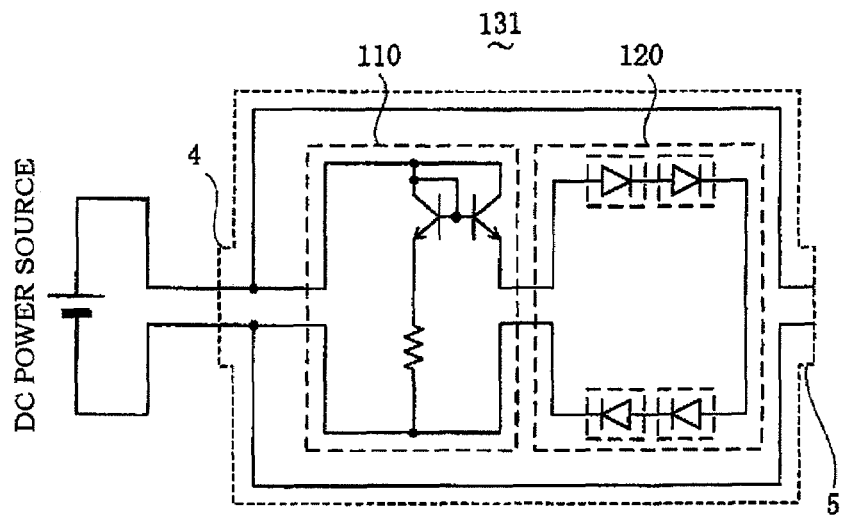
FIG. 23 is a circuit block diagram of a socket for electronic component in accordance with a twelfth embodiment.

As shown in FIG. 23, the electric power circuit 110 comprises at least a constant current circuit. As for the constant current circuit, a current mirror circuit can be used. In addition, the constant current circuit may be a circuit such as a back converter circuit other than the current mirror circuit. According to the socket 131 for electronic component of this embodiment, the socket for electronic component having an electric power circuit 110 suitable for combination with a DC electric power supply can be provided.

Figure 24:
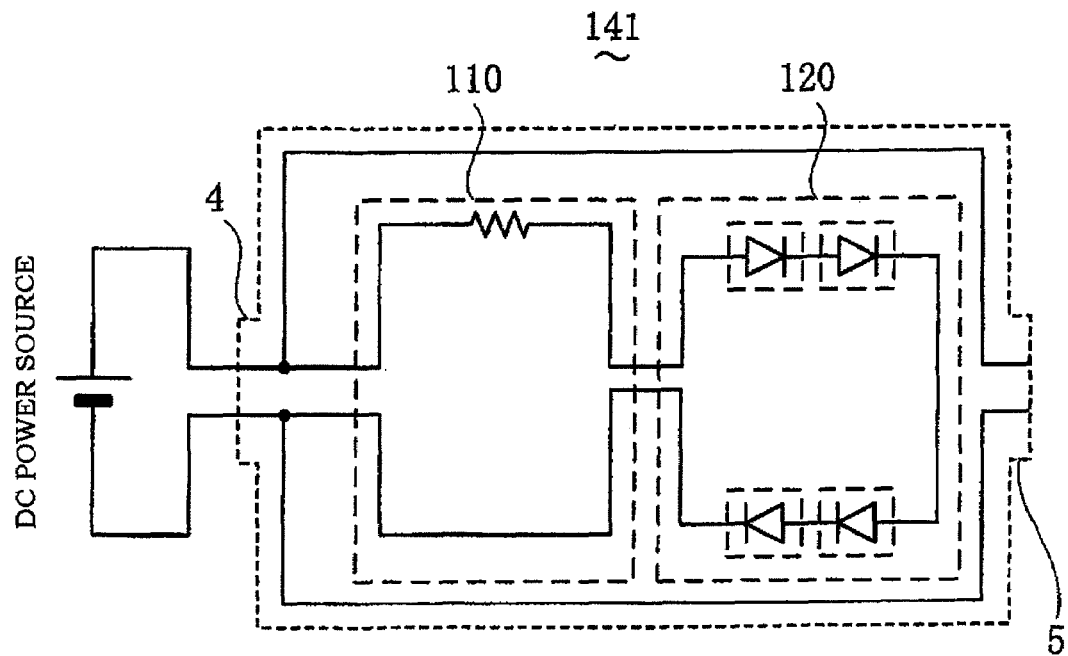
FIG. 24 is a circuit block diagram of a socket for electronic component in accordance with a thirteenth embodiment.

Subsequently, a socket for electronic component in accordance with a thirteenth embodiment of the present invention is described with reference to FIG. 24. A socket 141 for electronic component of this embodiment is different from that of the twelfth embodiment a point that the electric power circuit 110 for the DC electric power supply is configured by only a resistor. The points comprising the base, the containers, the connectors 4 and 5, the supports, the heat conductors, the inlet terminals and the outlet terminals are the same as those in the first embodiment or the like.

A function minimum required for the electric power circuit 110 is to prevent a current flow more than a largest rated current to the series circuit 120 of the LED packages which serves as a load. Thus, in this embodiment, a resistor is used as the electric power circuit 110 so as not to flow the current more than the largest rated current to the series circuit 120 of the LED packages. According to the configuration of this embodiment, a socket for electronic component comprising an electric power circuit 110 for a DC electric power supply can be provided inexpensively.

Subsequently, a socket for electronic component in accordance with a fourteenth embodiment of the present invention is described. A socket for electronic component of this embodiment is different from that of the thirteenth embodiment a point that a current more than a largest rated current may not be flown into a series circuit of LED packages when it is connected to an AC electric power supply. The points comprising the base, the containers, the connectors 4 and 5, the supports, the heat conductors, the inlet terminals and the outlet terminals are the same as those in the first embodiment or the like.

Figure 25:
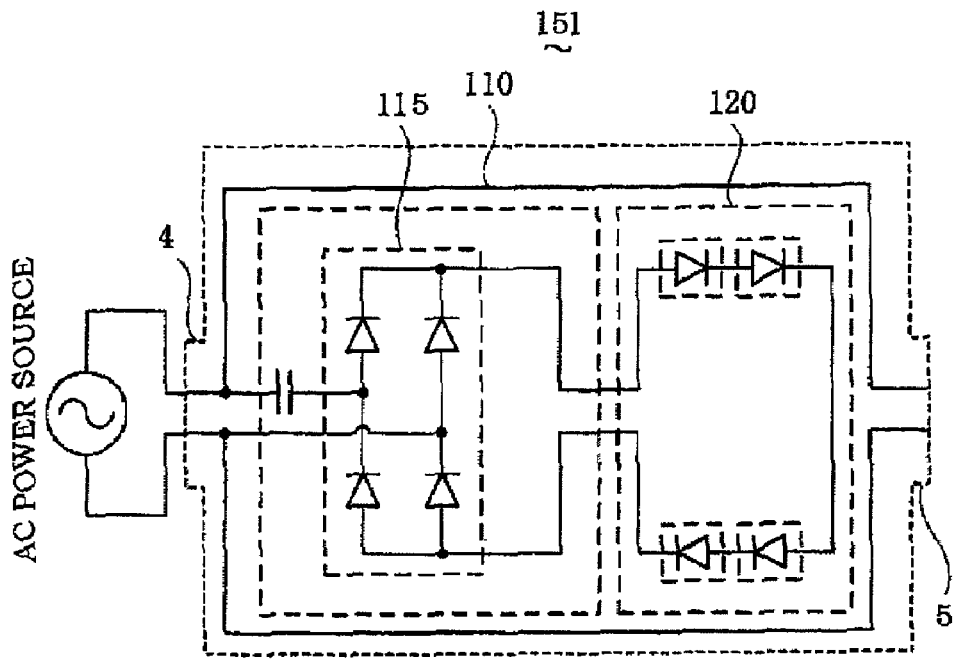
FIGS. 25(a) and 25(b) are circuit block diagrams of a socket for electronic component in accordance with a fourteenth embodiment of the present invention.
Figure 25:
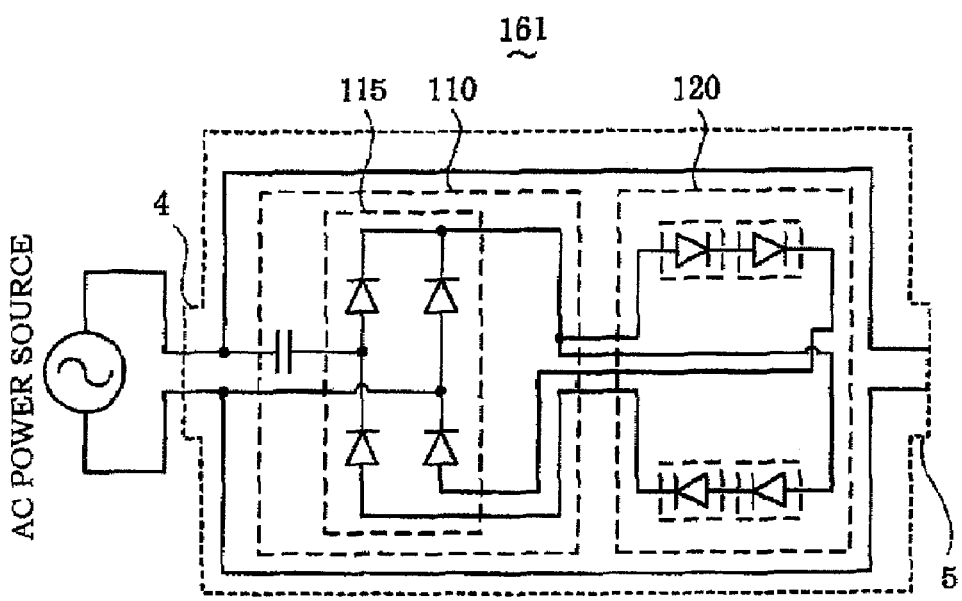

As shown in FIG. 25(*a*) or 25(*b*), when a socket 151 or 161 for electronic component is connected to an AC electric power supply, capacitors or inductors are disposed between the AC electric power supply and a rectification circuit 115, so that no current more than the largest rated current flows into the series circuit 120 of the LED packages. According to the configuration of this embodiment, a socket for electronic component comprising an electric power circuit 110 for an AC electric power supply can be provided inexpensively.

Figure 26:
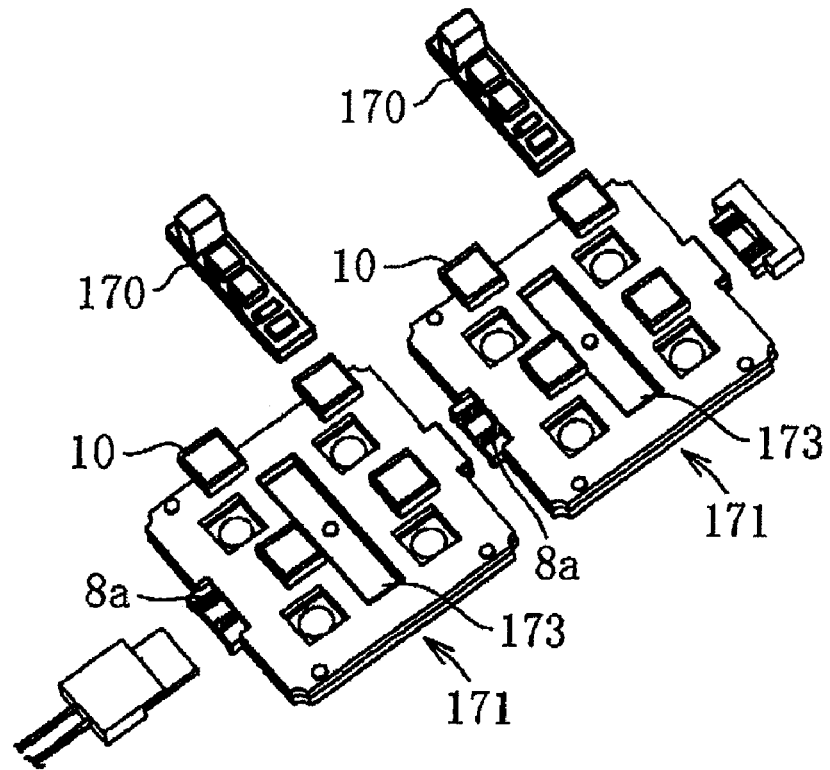
FIG. 26 is a perspective view of a socket for electronic component in accordance with a fifteenth embodiment.

Subsequently, a socket for electronic component in accordance with a fifteenth embodiment of the present invention is described with reference to FIG. 26. A socket 171 for electronic component of this embodiment is different from those of the tenth to fourteenth embodiments a point of comprising an electric power circuit container 173 for containing an electric power circuit 170. The points comprising the base, the containers, the connectors, the supports, the heat conductors, the inlet terminals and the outlet terminals are the same as those in the first embodiment or the like.

The electric power circuit container 173 comprises a pair of terminals connected to the inlet terminals 8*a* and so on, and a pair of terminals connected to the LED packages 10 (both of them are not illustrated in the figure). The electric power circuit 170 contained in the electric power circuit container 173 is installed to configure a block circuits of the above mentioned tenth to fourteenth embodiments.

According to the socket 171 for electronic component of this embodiment, the electric power circuit 170 can be selectively attached to the electric power circuit container 173 corresponding to required property, so that cost performance can be optimized corresponding to the use of the socket 171 for electronic component.

Figure 27:
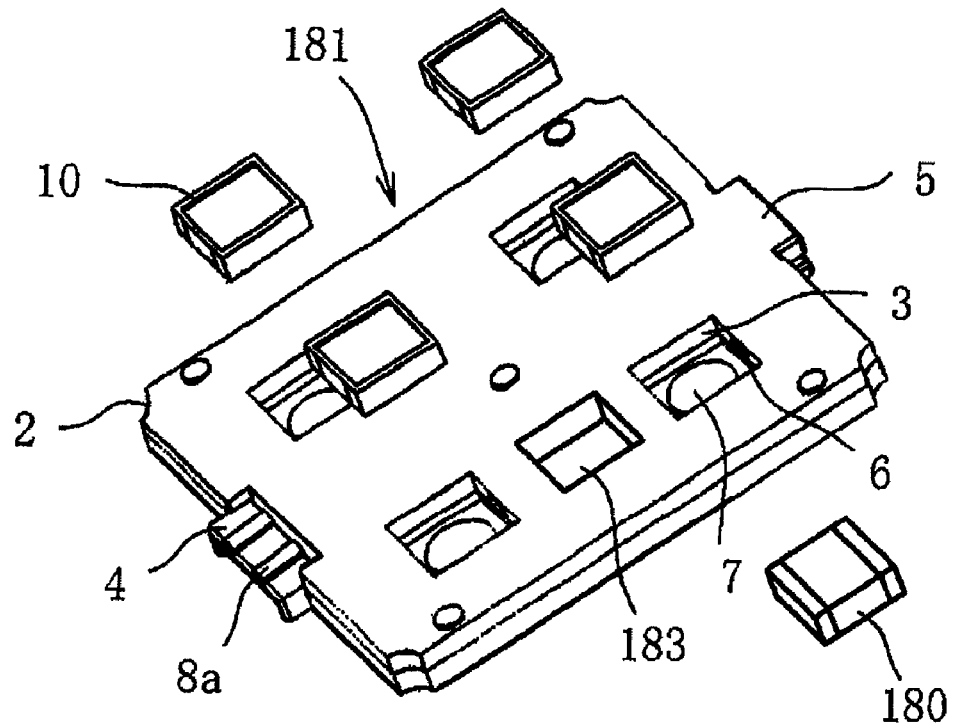
FIG. 27 is a perspective view of a socket for electronic component in accordance with a sixteenth embodiment.

Subsequently, a socket for electronic component in accordance with a sixteenth embodiment of the present invention is described. As shown in FIG. 27, a socket 181 for electronic component of this embodiment is different from those in other embodiments at a point to comprise a function element container 183 for containing a function element unit 180. The points comprising the base 2, the containers 3, the connectors 4 and 5, the supports 6, the heat conductors 7, the inlet terminals 8a and the outlet terminals 8b are the same as those in the first embodiment or the like.

Figure 28:
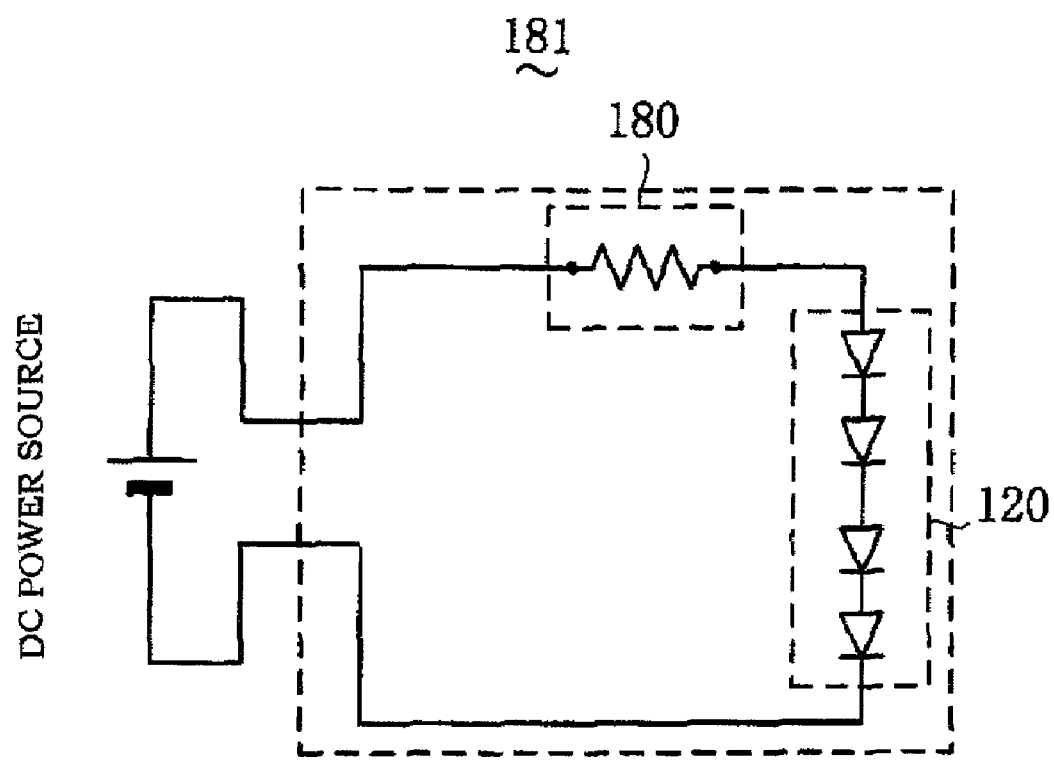
FIG. 28 is a circuit block diagram of the socket for electronic component.

The function element container 183 comprises a pair of terminals connected to the inlet terminals 8a and so on, and a pair of terminals connected to the LED packages 10 (both of them are not illustrated in the figure). The function element unit 180 contained in the function element container 183 is electrically connected to these terminals. FIG. 28 shows an example that a current-limiting resistor is used as the function element unit 180, and it is disposed between the DC electric power supply and the series circuit 120 of the LED packages.

Hereupon, forward voltage of an LED of InGaN system which is used for blue LED or green LED is generally different from that of an LED of AlInGaP system which is used for red LED or yellow LED (for example, the forward voltage of the LED of InGaN system is about 3.5 V, and the forward voltage of the LED of AlInGaP system is about 2.5 V). Thus, when the resistor in the circuit of the socket for electronic component is adjusted for the LED of InGaN system, and when LED packages each having an LED of AlInGaP system are installed in the containers, since the forward voltage becomes smaller, an excess current flows. For example, four LEDs of InGaN system are connected to the socket for electronic component, total forward voltage of the LEDs becomes 14 V. In a condition that the voltage of the electric power supply is set as 20 V inconsideration of variation of the voltage and the value of the resistor is selected about 17Ω ((20−14)÷0.35≈17) so as to limit the value of current to 350 mA, when the LED packages are interchanged to the LEDs of AlInGaP system (total forward voltage of them is 10 V), the value of the current becomes about 588 mA ((20−10)÷17≈0.588). Thus, current stress when using the LEDs of AlInGaP system becomes too large to shorten life of the LED packages.

Thus, the function element unit 180 can be interchanged corresponding to the kind of the LED packages 10 contained in the containers 3 or installation circumference in this embodiment. In the above mentioned example, when the LEDs of AlInGaP system are attached, the function element unit 180 is changed to attach a resistor of 29Ω ((20−10)÷0.35=29). According to such a modification, the value of the current when the LEDs of AlInGaP system are attached can be limited to about 350 mA. Although the current-limiting resistor is described as the function element unit in this embodiment, a zener diode or a series circuit of a zener diode and a resistor can be used to compensate a difference between total forward voltages of the series circuit of the LED packages and the electric power supply. In addition, as for the function element, a temperature sensing element such as a thermistor or a thermal protector can be used to add a protection function to decrease or to shut off outputs at a high temperature.

According to the socket 181 of this embodiment, the socket for electronic component can correspond to various types of LEDs with realizing various functions as modules. In addition, the present invention is not limited to the above mentioned configurations of the embodiments, and it can be modified in various manners.

The invention claimed is:

1. A socket for containing an electronic component, the socket comprising:
   a platy base;
   a container formed on the base to contain the electric component;
   at least two first terminals provided in the container and electrically connected to electrodes of the electric component;
   a connector provided on a side face of the base, the connector having second terminals electrically connected to the first terminals, and the connector configured to be coupled with another member other than the socket so as to supply electric power to the electric component through the second terminals;
   a support provided in the container to fix the electric component within the container; and
   a heat conductor comprising a material having a high heat conductivity and continuously provided from a bottom face of the container to a rear face of the base, the heat conductor contacting the electronic component contained in the container to conduct heat generated by the electronic component such that the heat generated by the electric component is radiated from a lower face side of the container of the base.

2. The socket for electronic component in accordance with claim 1, wherein
   the container is formed to penetrate through from the front face to rear face of the base;
   the support fixes the electric component so that a rear face of the electronic component becomes substantially the same plane of the rear face of the base; and
   the electronic component exposed from the rear face of the base is thermally coupled with a member on which the socket is mounted and which can easily radiate heat.

3. The socket for electronic component in accordance with claim 1, further comprising
   a wiring for heat radiation which is thermally connected to the heat conductor, continuously provided from a peripheral end of the container to a peripheral end of the base, and insulated from the first terminals and the second terminals.

4. The socket for electronic component in accordance with claim 1, further comprising
   a coolant passage which is thermally connected to the heat conductor, continuously provided from a peripheral end of the container to a peripheral end of the base, and insulated from the first terminals and the second terminals.

5. The socket for electronic component in accordance with claim 1, wherein
   the heat conductor comprises an elastic member having heat conductivity on a side contacting the electronic component.

6. The socket for containing an electronic component in accordance with claim 1, wherein
   the base has a first side face and a second side face which are parallel to each other;
   the connector includes a first connector provided on the first side face and configured to be coupled with a first member other than the socket by moving the connector in a coupling direction substantially perpendicular to the first side face, and a second connector provided on the second side face and configured to be coupled with a second member other than the socket by moving in the coupling direction;
   the first connector has a concave portion extending with a substantially constant width in a direction substantially parallel to the coupling direction of the base and the first member; and
   the second connector has a convex portion engageable with the concave portion and extending with a substantially constant width in the coupling direction.

7. The socket for electronic component in accordance with claim 6, wherein
the first connector and the second connector can have connectable shapes with shiplap.

8. The socket for electronic component in accordance with claim 1, wherein
the base has a first side face and a second side face which are parallel with each other;
the connector includes a first connector provided on the first side face and to be coupled with a first member other than the socket itself by moving in a coupling direction substantially perpendicular to the first side face, and a second connector provided on the second side face and coupled with a second member other than the socket itself by moving in the direction;
the first connector has at least one concave portion provided in a direction substantially parallel to the coupling direction of the base and the first member, and the concave portion has a substantially constant width in a direction substantially perpendicular to the coupling direction; and
the second connector has at least one convex portion engageable with the concave portion provided in the direction substantially parallel to the coupling direction, and the convex portion has a substantially constant width in the direction substantially perpendicular to the coupling direction.

9. The socket for electronic component in accordance with claim 1, further comprising
a power supply circuit to supply predetermined electric power to the electronic component.

10. The socket for containing an electronic component in accordance with claim 1, wherein
one of the first terminals is disposed on a side face of the container and a face of the heat conductor which appears on the bottom face of the container serves as another one of the first terminals.

11. The socket for containing an electronic component in accordance with claim 1, wherein the support is cantilevered.

* * * * *